United States Patent
Igarashi et al.

(10) Patent No.: US 9,663,714 B2
(45) Date of Patent: May 30, 2017

(54) PHOSPHOR AND METHOD FOR MANUFACTURING THE SAME, AND LIGHT-EMITTING DEVICE AND DISPLAY DEVICE USING PHOSPHOR

(75) Inventors: Takahiro Igarashi, Kanagawa (JP); Tsuneo Kusunoki, Kanagawa (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 12/469,315

(22) Filed: May 20, 2009

(65) Prior Publication Data
US 2009/0289546 A1    Nov. 26, 2009

(30) Foreign Application Priority Data
May 21, 2008   (JP) .................... 2008-132705

(51) Int. Cl.
C09K 11/77 (2006.01)
(52) U.S. Cl.
CPC ................... C09K 11/7734 (2013.01)
(58) Field of Classification Search
CPC ................................... C09K 11/7734
USPC .................................... 252/301.4 F
See application file for complete search history.

(56) References Cited

U.S. PATENT DOCUMENTS

2007/0029526 A1* 2/2007 Cheng et al. .......... 252/301.4 F
2007/0194695 A1   8/2007 Yoon et al.
2008/0111472 A1   5/2008 Liu et al.

FOREIGN PATENT DOCUMENTS

| | | |
|---|---|---|
| JP | 2006-36943 | 2/2006 |
| JP | 2006-68269 | 3/2006 |
| JP | 2007-131843 | 5/2007 |
| JP | 2007-227928 | 9/2007 |
| JP | 2008-050379 | 3/2008 |
| JP | 2008-081631 | 4/2008 |

OTHER PUBLICATIONS

Dexter. Theory of Concentration Quenching in Inorganic Phosphors. J. Chem. Phys. 22, 1063 (1954).*
Xu. The influence of BaF2 flux concentration on the luminescence of Sr3SiO5:Eu2+. Advanced Materials Research ISSN: 1662-8985, vols. 239-242, pp. 1400-1404.*
Jang et al., "Luminescent properties of (Sr1-xMx)3SiO5:Eu2+(M=Ca, Ba) phosphor for white emitting light source using blue.near Uv LEDs," Proc. IDW/AD '05 (2005) pp. 539-543.
Park et al., "Embodiment of the warm white-light-emitting diodes by using a Ba2+ codoped Sr3SiO5:Eu phosphor," Appl. Phys. Lett., 88, 043511-1--3 (2006).
Japanese Office Action for corresponding JP2008-132705 issued on Jun. 22, 2010.
European Search Report (EP 09 00 6731) dated Jul. 22, 2009.
Jul. 28, 2015 Office Action issued in European Application No. 09 006 731.5.

* cited by examiner

Primary Examiner — Matthew E Hoban
(74) Attorney, Agent, or Firm — Oliff PLC

(57) ABSTRACT

A phosphor includes $(Sr_{1-x}, Ba_x)_3SiO_5$ with $1>x\geq 0.1$ as a base material and europium (Eu) as an activator. The emission center wavelength of the phosphor is controlled to be 600 nm or more on the basis of the composition ratio of Sr, Ba, and Eu.

2 Claims, 12 Drawing Sheets

(a) x=1.00, Ba₃SiO₅:Eu          λ= 595 nm
(b) x=0.75, (Sr₀.₂₅, Ba₀.₇₅)₃SiO₅:Eu   λ= 602 nm
(c) x=0.50, (Sr₀.₅, Ba₀.₅)₃SiO₅:Eu    λ= 610 nm
(d) x=0.25, (Sr₀.₇₅, Ba₀.₂₅)₃SiO₅:Eu   λ= 608 nm
(e) x=0.00, Sr₃SiO₅:Eu          λ= 588 nm
(f) YAG                    λ= 565 nm (a) x = 1.00, Ba$_3$SiO$_5$:Eu  $\lambda$ = 595 nm (b) x = 0.75, (Sr$_{0.25}$, Ba$_{0.75}$)$_3$SiO$_5$:Eu  $\lambda$ = 602 nm (c) x = 0.50, (Sr$_{0.5}$, Ba$_{0.5}$)$_3$SiO$_5$:Eu  $\lambda$ = 610 nm (d) x = 0.25, (Sr$_{0.75}$, Ba$_{0.25}$)$_3$SiO$_5$:Eu  $\lambda$ = 608 nm (e) x = 0.00, Sr$_3$SiO$_5$:Eu  $\lambda$ = 588 nm (f) YAG  $\lambda$ = 565 nm

PEAK WAVELENGTH

FLUORESCENCE INTENSITY

FIG. 3

| Eu CONCENTRATION mol% | STRONTIUM CARBONATE | BARIUM CARBONATE | SILICON DIOXIDE | EUROPIUM OXIDE |
|---|---|---|---|---|
| 2 | 10.852 | 14.505 | 3.004 | 0.5278 |
| 4 | 10.630 | 14.209 | 3.004 | 1.056 |
| 6 | 10.409 | 13.913 | 3.004 | 1.584 |
| 8 | 10.187 | 13.617 | 3.004 | 2.112 |
| 10 | 9.9657 | 13.321 | 3.004 | 2.639 |

FIG. 5

| x | STRONTIUM CARBONATE | BARIUM CARBONATE | SILICON DIOXIDE | EUROPIUM OXIDE |
|---|---|---|---|---|
| 0.75 | 4.6507 | 21.0178 | 3.004 | 2.112 |
| 0.5 | 10.187 | 13.617 | 3.004 | 2.112 |
| 0.25 | 15.723 | 6.216 | 3.004 | 2.112 |

PHOSPHOR AND METHOD FOR MANUFACTURING THE SAME, AND LIGHT-EMITTING DEVICE AND DISPLAY DEVICE USING PHOSPHOR

CROSS REFERENCES TO RELATED APPLICATIONS

The present application claims priority to Japanese Priority Patent Application JP 2008-132705 filed in the Japan Patent Office on May 21, 2008, the entire content of which is hereby incorporated by reference.

BACKGROUND

The present application relates to a phosphor, and particularly to a phosphor that includes $(Sr_{1-x}, Ba_x)_3SiO_5$ as a base material and europium (Eu) as an activator and emits orange fluorescence, a method for manufacturing the phosphor, and a light-emitting device and a display device using the phosphor.

In recent years, blue light-emitting diodes (LEDs) mainly composed of gallium nitride that can efficiently emit light in a blue light wavelength range have been developed and are widely used. A white light-emitting device (white LED) has been developed by combining such a blue LED with a yellow phosphor, which emits yellow fluorescence under excitation with light in a blue-light wavelength range radiated from the blue LED. Since the white LED has a spectrum covering a wide wavelength range, its brightness in consideration of a visibility curve is high. Therefore, the white LED is used for an optical device such as a display device attached to a cellular phone or a camcorder. It is also used as a backlight of liquid crystal displays as a substitute for an existing small lamp or fluorescent lamp or the like. For example, $(Y, Gd)_3(Al, Ga)_5O_{12}:Ce$ is used as a yellow phosphor.

The white LED achieved by combining a blue LED with a yellow phosphor has a problem in that color rendering in a red-color region is low due to lack of red-light emission. Accordingly, a red phosphor that emits red fluorescence and an orange phosphor that emits orange fluorescence when excited with light in a blue-light wavelength range are actively developed. However, a red phosphor with an emission wavelength of 600 nm or more necessarily has a high proportion of covalent bonds in its crystal structure. Thus, only a few crystals are available, and sulfides and nitrides are the crystals most reported as a red phosphor.

There are some reports about an orange phosphor composed of a silicate of an alkaline-earth metal.

Japanese Unexamined Patent Application Publication No. 2005-68269 (paragraphs 0010 to 0014) (Patent Document 1) titled "PHOSPHOR AND TEMPERATURE SENSOR USING THE SAME" provides the following descriptions.

A base material constituting a phosphor according to the application of Patent Document 1 is a silicate of an alkaline-earth metal and is represented by a general formula $M_x(SiO_n)_y$, where n is a whole number of 3 or more, preferably 3 or more and 5 or less. In other words, silicon trioxide ($SiO_3$), silicon tetroxide ($SiO_4$), and silicon pentoxide ($SiO_5$) are preferred as the silicate. This is presumably because they can form a suitable crystal structure as a base material of a phosphor.

In the general formula, M represents one or more kinds of alkaline-earth metal elements. Examples of the alkaline-earth metals include magnesium (Mg), calcium (Ca), strontium (Sr), barium (Ba), and radium (Ra). Among these alkaline-earth metals, Sr and Ba are preferred because they can form a suitable crystal structure as a base material of a phosphor. An alkaline-earth metal M can be particularly represented by $(Ba_{1-a}, Sr_a)$, where a is a mixed crystal ratio ($0 \leq a \leq 1$). In the general formula, x and y each represents a whole number of 1 or more and x is determined in accordance with n and y. In the case of y=1 in the general formula, $x \geq 1$ is preferred. This means that, comparing an alkaline-earth metal with a silicate both contained in a base material on a molar basis, the number of moles of the alkaline-earth metal is larger than or equal to that of the silicate. This is presumably because such a composition is necessary to form a suitable crystal structure as a base material of a phosphor.

Examples of the silicate of the alkaline-earth metal that satisfies the conditions described above include $Ba_3SiO_5$, $Sr_3SiO_5$, $(Ba_{1-a}, Sr_a)_3SiO_5$, $Ba_2SiO_4$, and $\alpha$-$BaSiO_3$. Among these, $Ba_3SiO_5$, $Sr_3SiO_5$, and $(Ba_{1-a}, Sr_a)_3SiO_5$ have a tetragonal $Cs_3CoCl_5$-type crystal structure.

The phosphor includes a silicate of the alkaline-earth metal as a base material and lanthanoid ions as an activator, and is represented by a general formula, $La:M_x(SiO_n)_y$, where La is a lanthanoid. The lanthanoid is one of europium (Eu) and cerium (Ce), and is contained in the phosphor by taking form of $Eu^{2+}$ if it is Eu and $Ce^{3+}$ if it is Ce, for example. Eu or Ce is added to a base material as an oxide by taking form of $Eu_2O_3$ if it is Eu and $CeO_2$ if it is Ce. In this case, 0.001 to 0.2 atomic percent of the lanthanoid (La) relative to 1 atom of the alkaline-earth metal (M) is preferably added. In the case of less than 0.001 atomic percent, emission intensity decreases and sufficient brightness is not achieved. In the case of more than 0.2 atomic percent, quenching of light called concentration quenching is likely to occur.

Examples of the phosphor include $Eu^{2+}:Ba_3SiO_5$, $Ce^{3+}:Ba_3SiO_5$, $Eu^{2+}:Sr_3SiO_5$, $Ce^{3+}:Sr_3SiO_5$, $Eu^{2+}:(Ba_{1-a}, Sr_a)_3SiO_5$, $Ce^{3+}:(Ba_{1-a}, Sr_a)_3SiO_5$, $Eu^{2+}:Ba_2SiO_4$, $Ce^{3+}:Ba_2SiO_4$, $Eu^{2+}:BaSiO_3$, and $Ce^{3+}:BaSiO_3$.

In Japanese Unexamined Patent Application Publication No. 2006-36943 (paragraphs 0012 to 0014 and 0019 to 0020) (Patent Document 2) and Japanese Unexamined Patent Application Publication No. 2007-227928 (paragraphs 0017 and 0027 and FIG. 4) (Patent Document 3), a $Sr_3SiO_5$ phosphor is described, and Patent Document 2 titled "ORANGE PHOSPHOR" provides the following descriptions.

An orange phosphor according to the application of Patent Document 2 has a single phase crystal structure represented by the general formula $(Sr_{1-x}, EU_x)_3SiO_5$ ($0<x\leq0.10$) and exhibits a high-intensity orange light emission with a peak at around 580 nm.

At a firing temperature of 1300° C. or more or when firing is conducted at more than 1300° C., a phosphor having a single phase crystal structure that matches with a powder X-ray diffraction pattern of $Sr_3SiO_5$ registered in Joint Committee on Powder Diffraction Standards (JCPDS) Card No. 26-984 is achieved. This phosphor exhibits a high-intensity orange light emission with a peak at around 580 nm.

The orange phosphor has a crystal structure of $Sr_3SiO_5$ and a structure in which part of Sr is replaced with Eu as an activator. The ratio in which Sr is replaced with Eu is more than 0% but not more than 10% of the atomic weight of Sr. This is because light emission does not occur if Sr is not replaced with Eu. Furthermore, if more than 10% of Sr is replaced with Eu, the phosphor does not exhibit a high-intensity light emission due to photoexcitation in an ultraviolet to visible range caused by concentration quenching, formation of a multiphase crystal structure, or the like.

In Non-Patent Document 1 (J. K. Park et al, "Embodiment of the warm white-light-emitting diodes by using a $Ba^{2-}$ codoped $Sr_3SiO_5$:Eu phosphor", Appl. Phys. Lett., 88, 043511-1 to -3 (2006) (FIG. 1 and line 12 in right column of 043511-1 through line 15 in right column of 043511-2)), fluorescence spectra of $Sr_3SiO_5$:Eu samples (($Sr_{2.93-x}$, $Ba_x$)$SiO_5$:$Eu_{0.07}$ (x=0.0, 0.05, 0.10, and 0.20) as a function of $Ba^{2+}$ concentration are described. In the description, the entire spectra shift to longer wavelengths as the $Ba^{2-}$ concentration increases, and the peak wavelength shifts from 570 to 585 nm. In addition, the second phase, $BaSi_4O_9$ is formed when the $Ba^{2+}$ concentration exceeds 0.5 mol.

Non-Patent Document 2 (H. S. Jang, W. B. Im and D. Y. Jeon: "Luminescent properties of $(Sr_{1-x}M_x)_3SiO_5$:$Eu^{2+}$ (M=Ca, Ba) phosphor for white emitting light source using blue/near UV LEDs" Proc. IDW/AD'05 (2005) pp. 539-pp. 542) (FIG. 3, FIG. 4, Abstract, Results and discussion, Conclusion)) provides the following descriptions. When the number of $Eu^{2+}$ ions in a $Sr_3SiO_5$ host lattice increases, a shift of the emission wavelength to longer wavelengths is actually observed. In photoluminescence (PL) spectra of $(Sr_{1-x}, Ba_x)_3SiO_5$:$Eu^{2+}$ having a Ba concentration of 0 mol %, 20 mol %, 40 mol %, 60 mol %, and 80 mol %, when Sr sites are replaced with 20 mol % of $Ba^{2+}$, the emission band shifts to longer wavelengths, that is, a red shift occurs. When the Ba concentration exceeds 20 mol %, the emission band shifts to shorter wavelengths.

SUMMARY

In a white LED achieved by combining a blue LED and a yellow phosphor, color rendering in a red-color region is low due to lack of red-light emission. To improve the color rendering, the development of a phosphor that emits orange to red fluorescence by absorbing light in a blue-light wavelength range (400 to 480 nm) is desired. Sulfide phosphors and nitride phosphors are exemplified as a red phosphor having an emission wavelength of 600 nm or more. However, $H_2S$ gas is necessary to synthesize sulfide phosphors. Firing at high temperature and pressure in an expensive high-temperature-and-pressure firing furnace and complicated synthetic processes are necessary to synthesize nitride phosphors, which increases manufacturing cost. Since nitrides that are vulnerable to water are used as a starting material to synthesize nitride phosphors, such materials are dry-blended in a glove box. Therefore, paying attention to every detail is necessary for the synthesis.

In Non-Patent Document 1, a $(Sr_{2.93-x}, Ba_x)SiO_5$:$Eu_{0.07}$ phosphor (x=0.0, 0.05, 0.10, and 0.20) is described. In the description, the peak wavelength shifts from 570 to 585 nm as the $Ba^{2+}$ concentration in $Sr_3SiO_5$:Eu increases, and the shift stops at 585 nm. In addition, $BaSi_4O_9$ is formed when the $Ba^{2+}$ concentration exceeds 0.5 mol.

Suppose that, in $(Sr_{2.93-x}, Ba_x)SiO_5$:$Eu_{0.07}$ described in Non-Patent Document 1, Ba sites are replaced with Eu. Then, the base material of the phosphor is represented by $(Sr_{2.93-x}, Ba_{x+0.07})SiO_5$. In the case of (1) x=0.2, the base material of the phosphor is represented by $(Sr_{2.73}, Ba_{0.27})SiO_5$. In the case of (2) x=0.5, the base material of the phosphor is represented by $(Sr_{2.43}, Ba_{0.57})SiO_5$. If the base materials of (1) and (2) are represented by $(Sr_{1-x}, Ba_x)_3SiO_5$, x=0.27/3=0.09 is given in the base material of (1) and x=0.57/3=0.19 is given in the base material of (2).

Non-Patent Document 1 describes a $(Sr_{2.93-x}, Ba_x)_3SiO_5$:$Eu_{0.07}$ phosphor including 7 mol % Eu serving as an activator, but not phosphors having Eu concentrations other than 7 mol %. Non-Patent Document 1 does not teach phosphors with peak wavelengths (emission center wavelengths) exceeding 585 nm or phosphors including $(Sr_{1-x}, Ba_x)_3SiO_5$ with x≥0.1 as the base material represented by $(Sr_{1-x}, Ba_x)_3SiO_5$ and Eu as the activator. Furthermore, a phosphor including $(Sr_{1-x}, Ba_x)_3SiO_5$ with x≥0.2 as a base material and Eu as an activator is not described.

Non-Patent Document 2 discloses PL spectra of $Sr_3SiO_5$:$Eu^{2+}$ under 405 nm-excitation when the Eu concentration is changed to 0.5 mol %, 1.0 mol %, 1.5 mol %, 2.0 mol %, and 3.0 mol %, and that the emission wavelength shifts to longer wavelengths as the Eu concentration increases. Non-Patent Document 2 also teaches that, in PL spectra of $(Sr_{1-x}, Ba_x)_3SiO_5$:$Eu^{2+}$ having a Ba concentration of 0 mol %, 20 mol %, 40 mol %, 60 mol %, and 80 mol %, the emission band shifts to longer wavelengths when the Ba concentration is 20 mol %, and to shorter wavelengths when the Ba concentration exceeds 20 mol %.

However, Non-Patent Document 2 does not teach a phosphor having a peak wavelength (emission center wavelength) exceeding 600 nm and including $(Sr_{1-x}, Ba_x)_3SiO_5$ with x≥0.1 as a base material represented by $(Sr_{1-x}, Ba_x)_3SiO_5$ and more than 3 mol % of Eu or 6 mol % or more of Eu as an activator.

Accordingly, it is desirable to provide a phosphor that includes $(Sr_{1-x}, Ba_x)_3SiO_5$ with 1>x≥0.1 as a base material and europium (Eu) as an activator and that emits orange fluorescence, a method for manufacturing the phosphor, and a light-emitting device and a display device using the phosphor.

An embodiment provides a phosphor including $(Sr_{1-x}, Ba_x)_3SiO_5$ with 1>x≥0.1 as a base material; and europium (Eu) as an activator. The emission center wavelength of the phosphor is controlled to be 600 nm or more on the basis of a composition ratio of Sr, Ba, and Eu.

An embodiment also provides a method for manufacturing a phosphor including $(Sr_{1-x}, Ba_x)_3SiO_5$ as a base material and europium (Eu) as an activator, including the steps of preparing a mixture of compounds respectively including Sr, Ba, Si, and Eu, such that a molar ratio of Sr, Ba, and Si is Sr:Ba:Si=3(1-x):3x:1 where 1>x≥0.1, and a ratio of the number of moles of Eu to a total number of moles of Sr, Ba, and Eu is 0.02 or more and 0.08 or less; and firing the mixture at 1300° C. or more and 1700° C. or less. In the method, an emission center wavelength is controlled to be 600 nm or more on the basis of a composition ratio of Sr, Ba, and Eu.

An embodiment also provides a light-emitting device that uses the phosphor described above.

An embodiment also provides a display device having the light-emitting device that uses the phosphor described above, as a light source used for irradiating a display section.

The phosphor according to an embodiment includes $(Sr_{1-x}, Ba_x)_3SiO_5$ as a base material with 1>x≥0.1 and europium (Eu) as an activator and its emission center wavelength is controlled to be 600 nm or more on the basis of the composition ratio of Sr, Ba, and Eu. Thus, a phosphor that emits orange fluorescence and can improve color rendering in a red-color region can be provided.

The method for manufacturing a phosphor according to an embodiment includes the steps of preparing a mixture of compounds respectively including Sr, Ba, Si, and Eu, such that the molar ratio of Sr, Ba, and Si is Sr:Ba:Si=3(1-x):3x:1 where 1>x≥0.1, and the ratio of the number of moles of Eu to the total number of moles of Sr, Ba, and Eu is 0.02 or more and 0.08 or less; and firing the mixture at 1300° C. or more and 1700° C. or less. Thus, a method for manufacturing a phosphor that includes $(Sr_{1-x}, Ba_x)_3SiO_5$ as a base material and Eu as an activator, has an emission center wavelength of 600 nm or more controlled on the basis of the composition ratio of Sr, Ba, and Eu, emits orange fluorescence, and can improve color rendering in a red-color region can be provided. In the case where the ratio is 0.02 or more and 0.08 or less, the emission intensity of the phosphor is about 1.8 to about 2 times higher than that of a phosphor whose ratio is 0.1.

Since the light-emitting device according to an embodiment uses the phosphor described above, a light-emitting device that can improve color rendering can be provided.

Since the display device according to an embodiment includes the light-emitting device that uses the phosphor described above, as a light source used for irradiating a display section, a display device whose color rendering is improved can be provided.

Additional features and advantages are described in, and will be apparent from, the following Detailed Description and the figures.

BRIEF DESCRIPTION OF THE FIGURES

FIG. 3 is a table showing the amounts of raw materials blended in synthesis of a $(Sr_{1-x}, Ba_x)_3SiO_5$:Eu phosphor (x=0.5), with a variety of Eu concentrations in Example of an embodiment;

FIG. 5 is a table showing the amounts of raw materials blended in synthesis of $(Sr_{1-x}, Ba_x)_3SiO_5$:Eu phosphors (x=0.25, 0.5, and 0.75; Eu=8 mol %) in Example of an embodiment;

DETAILED DESCRIPTION

Figure 1:
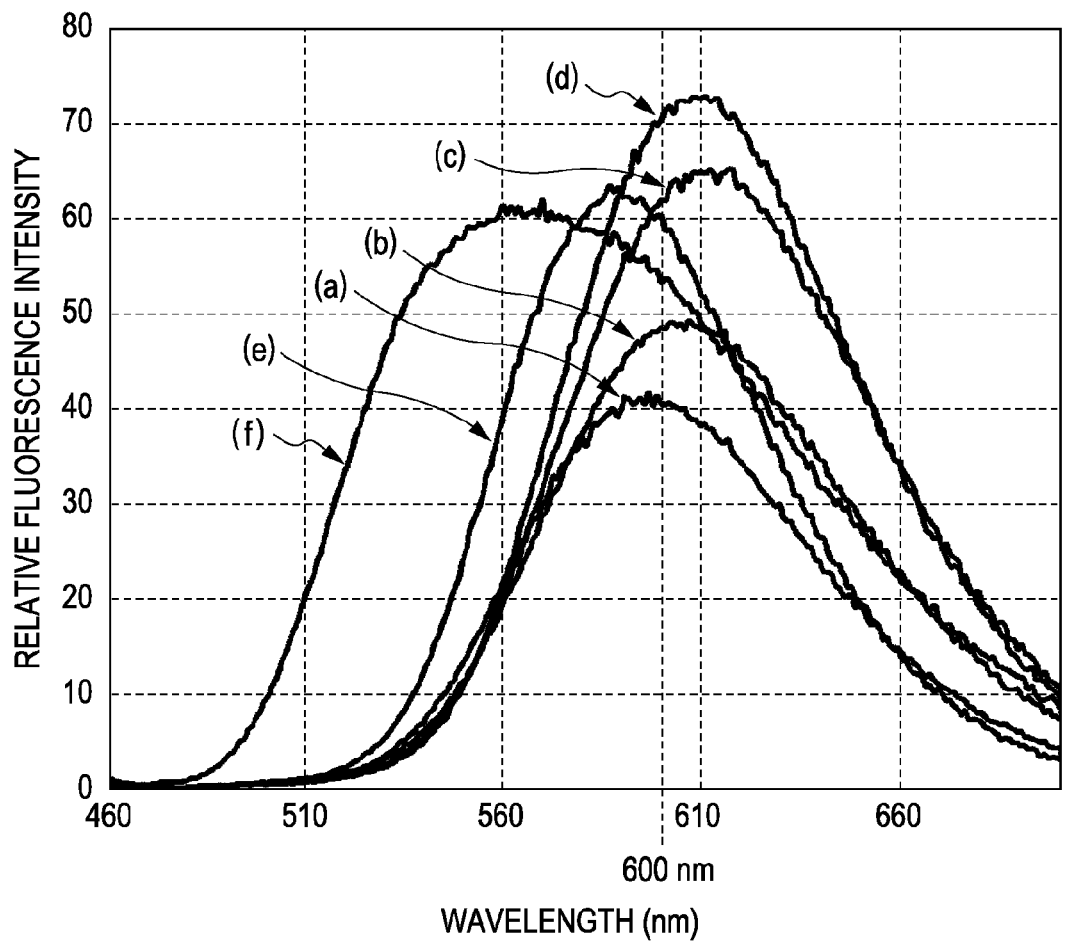
FIG. 1 is a graph showing fluorescence spectra of $(Sr_{1-x}, Ba_x)_3SiO_5$:Eu phosphors in Example of an embodiment.

In the phosphor according to an embodiment, preferably x≥0.2. When x≥0.2, a phosphor that has an emission center wavelength of 600 nm or more and can improve color rendering in a red-color region can be achieved. Particularly in the case of x≤0.5, a phosphor that has a higher fluorescence intensity than a yellow yttrium-aluminum-garnet (YAG) phosphor $((Y_{1.5}, Gd_{1.5})(Al_2, Ga_3)O_{12}:Ce)$ emitting yellow fluorescence and that has an emission center wavelength of 606 nm or more and can improve color rendering in a red-color region can be achieved. In the case of 0.5≥x≥0.1, the fluorescence intensity of a $(Sr_{1-x}, Ba_x)_3SiO_5$:Eu phosphor is about 1.07 to about 1.20 times higher than that of the yellow YAG phosphor.

Preferably 0.8≥x. When 0.8≥x, a phosphor that has an emission center wavelength of 600 nm or more and can improve color rendering in a red-color region can be achieved. Particularly in the case of x≤0.5, the phosphor has a higher fluorescence intensity than the yellow YAG phosphor. In the case of 0.5≥x≥0.1, the fluorescence intensity of a $(Sr_{1-x}, Ba_x)_3SiO_5$:Eu phosphor is about 1.07 to about 1.20 times higher than that of the yellow YAG phosphor.

Preferably 0.5≥x. When 0.5≥x, a phosphor that has a higher fluorescence intensity than the yellow YAG phosphor and that has an emission center wavelength of 600 nm or more and can improve color rendering in a red-color region can be achieved. In the case of 0.5≥x≥0.1, the fluorescence intensity of a $(Sr_{1-x}, Ba_x)_3SiO_5$:Eu phosphor is about 1.07 to about 1.20 times higher than that of the yellow YAG phosphor.

The concentration of the activator is preferably 2 mol % or more and 8 mol % or less. At such a concentration, the emission intensity of the phosphor is about 1.8 to about 2 times higher than that of a phosphor having an activator concentration of 10 mol %. Thus, a phosphor that has a high fluorescence intensity and can improve color rendering in a red-color region can be achieved.

The concentration of the activator is preferably 6 mol % or more and 8 mol % or less. At such a concentration, the emission intensity of the phosphor is about 1.9 to about 2 times higher than that of a phosphor having an activator concentration of 10 mol %. Thus, a phosphor that has a higher fluorescence intensity and can improve color rendering in a red-color region can be achieved.

The phosphor preferably emits fluorescence when excited with blue light. Such a phosphor can be excited by a light-emitting element that emits the blue light. A white light-emitting device can be configured by mixing the blue light and orange fluorescence emitted from the phosphor. In addition, a display element that uses the light-emitting device as a light source used for irradiating a display section can be achieved. "The blue light" mentioned herein means "light in a blue-light wavelength range", which has a wavelength of 400 to 480 nm (the same shall apply hereinafter).

The phosphor is preferably synthesized by firing a mixture of compounds respectively including Sr, Ba, Si, and Eu at 1300° C. or more and 1700° C. or less, the mixture being prepared such that a molar ratio of Sr, Ba, and Si is Sr:Ba:Si=3(1−x):3x:1 where 1>x≥0.1, and a ratio of the number of moles of Eu to a total number of moles of Sr, Ba, and Eu is 0.02 or more and 0.08 or less. In the case where 1>x≥0.1 and the ratio is 0.02 or more and 0.08 or less, the emission intensity of the phosphor is about 1.8 to about 2 times higher than that in the case where the ratio is 0.1. Thus, a phosphor that has a high fluorescence intensity, emits orange fluorescence whose emission center wavelength is 600 nm or more, and can improve color rendering in a red-color region can be achieved.

In the method for manufacturing the phosphor according to an embodiment, preferably x≥0.2. When x≥0.2, a method for manufacturing a phosphor that has an emission center wavelength of 600 nm or more and can improve color rendering in a red-color region can be provided. Particularly in the case of x≤0.5, a method for manufacturing a phosphor that has a higher fluorescence intensity than the yellow YAG phosphor and that has an emission center wavelength of 606 nm or more and can improve color rendering in a red-color region can be provided. In the case of 0.5≥x≥0.1, the fluorescence intensity of a $(Sr_{1-x}, Ba_x)_3SiO_5$:Eu phosphor is about 1.07 to about 1.20 times higher than that of the yellow YAG phosphor.

Preferably 0.8≥x. When 0.8≥x, a method for manufacturing a phosphor that has an emission center wavelength of 600 nm or more and can improve color rendering in a red-color region can be provided. Particularly in the case of x≤0.5, a method for manufacturing a phosphor having a higher fluorescence intensity than the yellow YAG phosphor can be provided. In the case of 0.5≥x≥0.1, the fluorescence intensity of a $(Sr_{1-x}, Ba_x)_3SiO_5$:Eu phosphor is about 1.07 to about 1.20 times higher than that of the yellow YAG phosphor.

Preferably 0.5≥x. When 0.5≥x, a method for manufacturing a phosphor that has a higher fluorescence intensity than the yellow YAG phosphor and that has an emission center wavelength of 600 nm or more and can improve color rendering in a red-color region can be provided. In the case of 0.5≥x≥0.1, the fluorescence intensity of a $(Sr_{1-x}, Ba_x)_3SiO_5$:Eu phosphor is about 1.07 to about 1.20 times higher than that of the yellow YAG phosphor.

The concentration of the activator is preferably 2 mol % or more and 8 mol % or less. At such a concentration, the emission intensity of the phosphor is about 1.8 to about 2 times higher than that of a phosphor having an activator concentration of 10 mol %. Thus, a method for manufacturing a phosphor that has a high fluorescence intensity and can improve color rendering in a red-color region can be provided.

The concentration of the activator is preferably 6 mol % or more and 8 mol % or less. At such a concentration, the emission intensity of the phosphor is about 1.9 to about 2 times higher than that of a phosphor having an activator concentration of 10 mol %. Thus, a method for manufacturing a phosphor that has a higher fluorescence intensity and can improve color rendering in a red-color region can be provided.

The phosphor preferably emits fluorescence when excited with blue light. In this case, a method for manufacturing a phosphor that can be excited by a light-emitting element that emits the blue light can be provided. In the method, a white light-emitting device can be configured by mixing the blue light and orange fluorescence emitted from the phosphor. In addition, a display element that uses the light-emitting device as a light source used for irradiating a display section and a phosphor that can improve color rendering in a red-color region can be achieved.

In a light-emitting device according to an embodiment, the phosphor is preferably excited by a light-emitting element that emits blue light. In this case, the phosphor emits orange fluorescence when excited with blue light emitted from the light-emitting element, and the orange fluorescence is mixed with the blue light to realize a light-emitting device that emits white light with improved color rendering.

In a display device according to an embodiment, the phosphor is preferably excited by a light-emitting element that emits blue light. In this case, the phosphor emits orange fluorescence when excited with blue light emitted from the light-emitting element, and the orange fluorescence is mixed with the blue light to realize a light-emitting device that emits white light with improved color rendering. Since the display device includes such a light-emitting device, a display device with intense light in a red-color region can be achieved.

Regarding a silicon pentoxide phosphor including $(Sr_{1-x}, Ba_x)_3SiO_5$ as a base material and Eu as an activator, its fluorescence spectrum characteristics resulting from excitation with blue light are considered to significantly vary on the basis of the composition ratio of Sr, Ba, and Eu. In other words, the width of a fluorescence spectrum, an emission center wavelength, and a peak fluorescence intensity are considered to vary on the basis of not only the composition ratio of Sr and Ba but also that of Eu.

In the present application, the variation in the fluorescence spectrum characteristics of the silicon pentoxide phosphor based on the composition ratio of Sr, Ba, and Eu was examined. Consequently, a phosphor with a fluorescence spectrum having a high peak fluorescence intensity in an orange-light wavelength range, an emission center wavelength of 600 nm or more, and a broad distribution ranging from a yellow-light wavelength range to a red-light wavelength range was obtained. It was found that the color rendering in a red-color region could be improved by using this phosphor.

The phosphor according to an embodiment includes $(Sr_{1-x}, Ba_x)_3SiO_5$ with 1>x≥0.1 as a base material and Eu as an activator. The phosphor has an emission center wavelength of 600 nm or more controlled on the basis of the composition ratio of the Sr, Ba, and Eu, is excited by light in a blue-light wavelength range (blue light; 400 to 480 nm), emits high-intensity orange fluorescence having an emission center wavelength of 600 nm or more, and can improve color rendering in a red-color region. More preferably x≥0.2. Preferably 0.8≥x, and more preferably 0.5≥x.

The concentration of the activator is preferably 2 mol % or more and 8 mol % or less, more preferably 6 mol % or more and 8 mol % or less. In the case of 0.5≥x≥0.1, the fluorescence intensity of the $(Sr_{1-x}, Ba_x)_3SiO_5$:Eu phosphor is about 1.07 to about 1.20 times higher than that of the yellow YAG phosphor $(Y_{1.5}, Gd_{1.5})(Al_2, Ga_3)O_{12}$:Ce. In the case where the concentration of the activator is 2 mol % or more and 8 mol % or less, the emission intensity of the phosphor is about 1.8 to about 2 times higher than that of a phosphor having an activator concentration of 10 mol %. In the case where the activator concentration is 6 mol % or more and 8 mol % or less, the emission intensity of the phosphor is about 1.9 to about 2 times higher than that of a phosphor having an activator concentration of 10 mol %.

In the phosphor according to an embodiment, compounds respectively including Sr, Ba, Si, and Eu are weighed such that the molar ratio (or atomic ratio) of metal elements Sr, Ba, and Si is Sr:Ba:Si=3(1−x):3x:1 where 1>x≥0.1 and the ratio ($=N_{Eu}/N_T$) (molar ratio or atomic ratio) of the number of moles of Eu, $N_{Eu}$ (or atomicity) to the total number of moles of Sr, Ba, and Eu, $N_T$ ($N_T$=3) (or total atomicity in a chemical formula of the phosphor) is 0.02 or more and 0.08 or less, preferably 0.06 or more and 0.08 or less. The phosphor is then synthesized from the compounds. $N_{Sr}$, $N_{Ba}$, and $N_{Eu}$ denote the numbers of moles of Sr, Ba, and Eu, respectively, and $NT=N_{Sr}+N_{Ba}+N_{Eu}=3$.

In the case where the ratio described above is 0.02 or more and 0.08 or less, the emission intensity of the phosphor is about 1.8 to about 2 times higher than that of a phosphor whose ratio is 0.1. In the case where the ratio described above is 0.06 or more and 0.08 or less, the emission intensity of the phosphor is about 1.9 to about 2 times higher than that of a phosphor whose ratio is 0.1.

That is to say, powders of compounds respectively including Sr, Ba, Si, and Eu are weighed such that the resulting phosphor includes $(Sr_{1-x}, Ba_x)_3SiO_5$ with $1>x\geq 0.1$ as a base material and Eu as an activator, where the Eu concentration (molar percent or atomic percent) is 2% or more and 8% or less ($0.02\leq(N_{Eu}/N_T)\leq 0.08$), preferably 6% or more and 8% or less ($0.06\leq(N_{Eu}/N_T)\leq 0.08$). The powders are mixed and crushed to prepare a mixture.

The mixture is fired at 1300° C. or more and 1700° C. or less to synthesize a phosphor. To achieve a phosphor having a desired composition, the mixture is preferably fired at 1600° C. in an inert gas atmosphere containing 4% or less of hydrogen on a volume basis.

The compounds respectively including Sr, Ba, Si, and Eu are mainly oxides, carbonates, oxalates, etc., but not limited to these. The compounds may be other inorganic salts or organic compounds such as organic salts.

In the method for manufacturing the phosphor according to an embodiment, the mixture is prepared such that the emission center wavelength is controlled to be 600 nm or more on the basis of the composition ratio of Sr, Ba, and Eu; the molar ratio (or atomic ratio) of metal elements Sr, Ba, and Si is Sr:Ba:Si=3(1−x):3x:1 where $1>x\geq 0.1$; and the ratio ($=N_{Eu}/N_T$) (molar ratio or atomic ratio) of the number of moles of Eu, $N_{Eu}$ (or atomicity) to the total number of moles of Sr, Ba, and Eu, $N_T$ ($N_T=3$) (or total atomicity in a chemical formula of the phosphor) is 0.02 or more and 0.08 or less, preferably 0.06 or more and 0.08 or less. The mixture is then fired to synthesize the phosphor.

In other words, the method for manufacturing the phosphor includes a raw material preparation step of weighing the compounds respectively including Sr, Ba, Si, and Eu such that the Eu concentration (molar percent or atomic percent) is 2% or more and 8% or less, preferably 6% or more and 8% or less, and then preparing a mixture by mixing and crushing the compounds; and a firing step of firing the mixture at 1300° C. or more and 1700° C. or less. In the method, the emission center wavelength is controlled to be 600 nm or more on the basis of the composition ratio of Sr, Ba, and Eu.

In the firing step, the mixture is preferably fired at 1600° C. for four hours in an inert gas atmosphere containing 4% or less of hydrogen on a volume basis. As a result, the phosphor that includes $(Sr_{1-x}, Ba_x)_3SiO_5$ as a base material and Eu as an activator, emits high-intensity orange fluorescence with an emission center wavelength of 600 nm or more, and can improve color rendering in a red-color region can be manufactured.

The emission intensity of the phosphor manufactured by the method described above having a Eu concentration of 2% or more and 8% or less is about 1.8 to about 2 times higher than that of a phosphor having a Eu concentration of 10%. The emission intensity of the phosphor having a Eu concentration of 6% or more and 8% or less is about 1.9 to about 2 times higher than that of a phosphor having a Eu concentration of 10%.

An embodiment will now be described in detail with reference to a drawing.

EMBODIMENT

A phosphor according to an embodiment is excited by light in a blue-light wavelength range from 400 to 480 nm, has an emission center wavelength of 600 nm or more, and includes $(Sr_{1-x}, Ba_x)_3SiO_5$ with $1>x\geq 0.1$ as a base material and Eu as an activator. Preferably $x\geq 0.2$, more preferably $0.8\geq x$, more preferably $0.5\geq x$. In the case of $0.5\geq x\geq 0.1$, the fluorescence intensity of the $(Sr_{1-x}, Ba_x)_3SiO_5$:Eu phosphor is about 1.07 to about 1.20 times higher than that of the yellow YAG phosphor $(Y_{1.5}, Gd_{1.5})(Al_2, Ga_3)O_{12}$:Ce.

The phosphor according to an embodiment can be suitably used for a light-emitting device and a display device. In particular, the phosphor can be suitably used for a display device such as a liquid crystal device that uses a light-emitting device such as a white LED.

In the description hereinafter, a phosphor including $(Sr_{1-x}, Ba_x)_3SiO_5$ ($1>x\geq 0.1$) as a base material and Eu as an activator is represented by $(Sr_{1-x}, Ba_x)_3SiO_5$:Eu, where x represents the composition of a base material. A Eu concentration is represented by the ratio ($=N_{Eu}/N_T$) (molar percent or atomic percent) of the number of moles of Eu, $N_{Eu}$ (or atomicity) to the total number of moles of Sr, Ba, and Eu, $N_T$ ($N_T=3$) (or total atomicity in a chemical formula of the phosphor). Particularly when the composition of elements of a phosphor is clearly described, the phosphor is represented by $(Sr_a, Ba_b)SiO_5$:$Eu_c$ (a>0, b>0, c>0, a+b+c=3).

Figure 13:
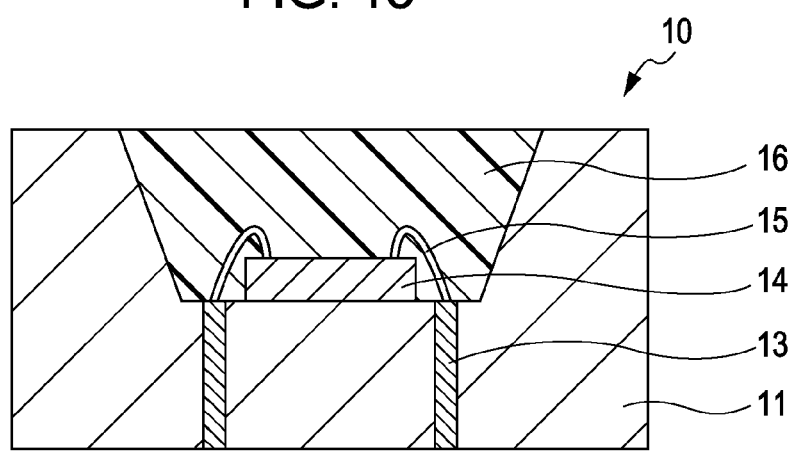
FIG. 13 is a sectional view of a white light-emitting device in an embodiment of an embodiment.

FIG. 13 is a sectional view of a white light-emitting device (light-emitting device, white LED) that uses the phosphor in an embodiment.

In a white light-emitting device 10, as shown in FIG. 13, an InGaN blue LED 14 is mounted on the bottom of a reflector cup disposed in a casing 11 and the blue LED 14 is connected to terminal electrodes 13 through bonding wires 15. The reflector cup has a depressed portion with a reflecting surface to improve the directivity of light emission by reflection. The terminal electrodes 13 are connected to an external power source (not shown).

The blue LED 14 is sealed, for example, in a molding portion 16 containing a transparent epoxy resin and dispersed orange phosphor according to an embodiment. A lens for adjusting a divergence angle of emission light may be disposed on the upper surfaces of the molding portion 16 and the casing 11.

The orange phosphor emits orange fluorescence when excited with light in a blue-light wavelength range emitted from the blue LED 14. The orange fluorescence is mixed with the light in a blue-light wavelength range emitted from the blue LED 14, and the white light-emitting device 10 produces white light. White light emitted from an existing white light-emitting device achieved by combining a blue LED with a YAG phosphor that emits yellow fluorescence includes less red-light components and exhibits low color rendering in a red-color region.

Since white light emitted from the white light-emitting device achieved by combining the blue LED and the orange phosphor according to an embodiment is produced by mixing light in a blue-light wavelength range emitted from the blue LED with the orange fluorescence emitted from the orange phosphor, red-light components can be increased and color rendering can be improved. Such a white light-emitting device can be suitably used as a backlight of liquid crystal displays.

Furthermore, the orange phosphor according to an embodiment can be mixed with the YAG phosphor that emits yellow fluorescence. In other words, the orange phosphor according to an embodiment and the YAG phosphor that emits yellow fluorescence can be mixed and dispersed, for example, in a resin constituting the molding portion 16 shown in FIG. 13 such as a transparent epoxy resin. This can further increase red-light components and improve color rendering to achieve a white light-emitting device with low color temperature. By using such a white light-emitting device as a backlight of a liquid crystal display, a liquid crystal display with brighter light in a red-color region can be achieved.

EXAMPLE

FIG. 1 is a graph showing fluorescence spectra of $(Sr_{1-x}, Ba_x)_3SiO_5$:Eu phosphors (the composition x of a base material=0.0, 0.25, 0.5, 0.75, and 1.0) in Example of an embodiment.

In FIG. 1, the abscissa indicates wavelengths (nm) and the ordinate indicates relative fluorescence intensities. In the graph, (a) is a fluorescence spectrum of a $Ba_3SiO_5$:Eu phosphor with x=1.0, (b) is a fluorescence spectrum of a $(Sr_{0.25}, Ba_{0.75})_3SiO_5$:Eu phosphor with x=0.75, (c) is a fluorescence spectrum of a $(Sr_{0.5}, Ba_{0.5})_3SiO_5$:Eu phosphor with x=0.5, (d) is a fluorescence spectrum of a $(Sr_{0.75}, Ba_{0.25})_3SiO_5$:Eu phosphor with x=0.25, (e) is a fluorescence spectrum of a $Sr_3SiO_5$:Eu phosphor with x=0.0, and (f) is a fluorescence spectrum of a yellow YAG phosphor.

The yellow YAG phosphor is commercially available (Y, Gd)$_3$(Al, Ga)$_5$O$_{12}$:Ce whose ratio of elements constituting its base material is Y:Gd=1:1 and Al:Ga=2:3, that is, $(Y_{1.5}, Gd_{1.5})(Al_2, Ga_3)O_{12}$:Ce. In FIG. 1, the Eu concentration of each of phosphors is 8 mol %, and a method for synthesizing the phosphors (a) to (e) is described below (refer to the descriptions regarding FIGS. 3 and 5).

In FIG. 1, the excitation wavelength is 450 nm. As shown in a space below FIG. 1, the peak wavelengths (emission center wavelengths) of fluorescence spectra of the phosphors (a) to (f) are 595 nm, 602 nm, 610 nm, 608 nm, 588 nm, and 565 nm, respectively. The fluorescence spectra were measured with a measurement system Florog 3 available from JOBIN YVON that uses Xe as an excitation light source.

Each of the emission center wavelengths λ of the fluorescence spectra of (b) $(Sr_{0.25}, Ba_{0.75})_3SiO_5$:Eu, (c) $(Sr_{0.5}, Ba_{0.5})_3SiO_5$:Eu, and (d) $(Sr_{0.75}, Ba_{0.25})_3SiO_5$:Eu is 600 nm or more, which is in an orange-light wavelength range. The fluorescence spectra, which contain the wavelength components of a yellow-light wavelength range and a red-light wavelength range, are broad.

Figure 2A:
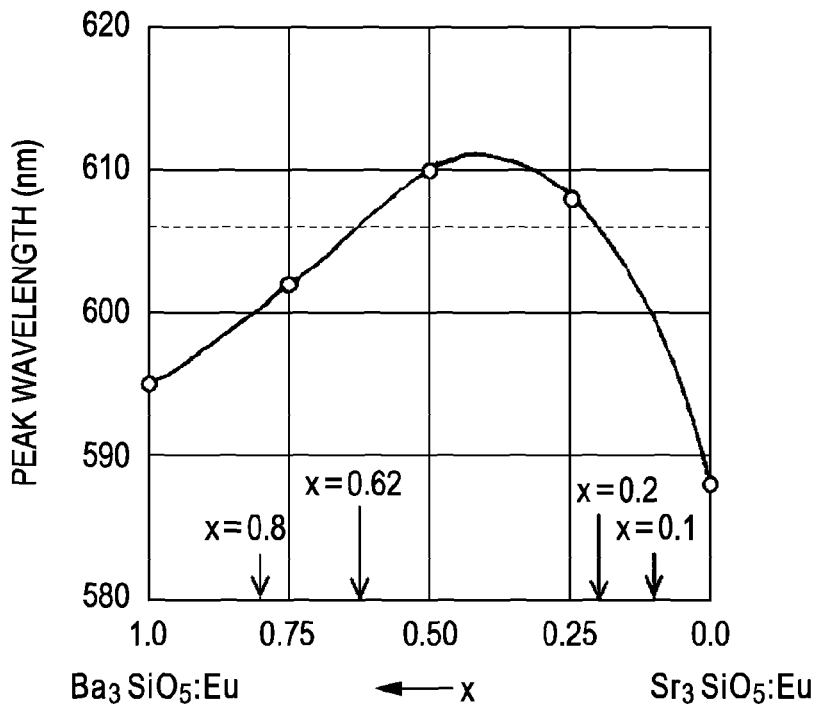
FIGS. 2A and 2B are graphs showing a relationship between the composition x and fluorescence properties of $(Sr_{1-x}, Ba_x)_3SiO_5$:Eu phosphors in Example of an embodiment.
Figure 2B:
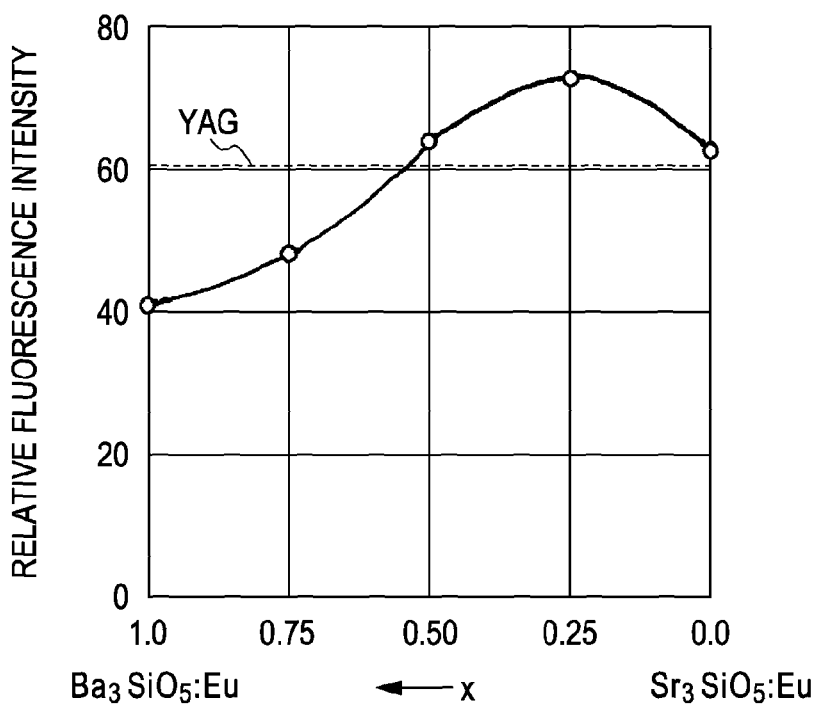

FIGS. 2A and 2B are graphs showing a relationship between the composition x of a base material and fluorescence properties of $(Sr_{1-x}, Ba_x)_3SiO_5$:Eu phosphors in Example of an embodiment, which are drawn by organizing the results shown in FIG. 1.

FIG. 2A shows the peak wavelength (emission center wavelength) of fluorescence spectra as a function of the composition x of a base material. FIG. 2B shows the relative fluorescence intensity of fluorescence spectra as a function of the composition x of a base material. The relative fluorescence intensity is given as a relative value such that the fluorescence intensities of different phosphors can be compared with each other. Thus, the peak intensity of any phosphor can be used as a reference.

As shown in FIG. 2A, the peak wavelengths λ (emission center wavelength) of fluorescence spectra of $(Sr_{1-x}, Ba_x)_3SiO_5$:Eu phosphors shift from 588 nm to longer wavelengths as the composition x increases from x=0.0. At about x=0.4, the amount of the shift reaches its peak and a maximum peak wavelength of about 610 nm is achieved. As x further increases to x=1.0, the emission wavelength shifts from the maximum peak wavelength to shorter wavelengths. At x=1.0, λ is 595 nm.

In the case of 1>x≥0.1, each of the emission center wavelengths λ of the fluorescence spectra of $(Sr_{1-x}, Ba_x)_3SiO_5$:Eu phosphors is longer than the emission center wavelengths λ of the fluorescence spectra of $Ba_3SiO_5$:Eu and $Sr_3SiO_5$:Eu phosphors, and λ is more than 595 nm and the maximum peak wavelength is 610 nm. In the case of 0.8≥x≥0.1, each of the emission center wavelengths λ of fluorescence spectra is 600 nm or more and the maximum peak wavelength is 610 nm. In the case of 0.62≥x≥0.2, each of the emission center wavelengths λ of fluorescence spectra is 606 nm or more and the maximum peak wavelength is 610 nm.

As shown in FIG. 2B, the relative fluorescence intensity of $(Sr_{1-x}, Ba_x)_3SiO_5$:Eu phosphors increases as the composition x increases from x=0.0, and reaches its peak at x=0.25. As x further increases to x=1.0, the relative fluorescence intensity decreases, and finally, the relative fluorescence intensity of a $Ba_3SiO_5$:Eu phosphor becomes lower than that of a $Sr_3SiO_5$:Eu phosphor. In the case of x=0.25, the fluorescence intensity of a $(Sr_{1-x}, Ba_x)_3SiO_5$:Eu phosphor is about 1.20 times higher than that of a yellow YAG phosphor $(Y_{1.5}, Gd_{1.5})(Al_2, Ga_3)O_{12}$:Ce.

In the case where the composition x of a base material is 0.5≥x>0.1, the relative fluorescence intensity of the fluorescence spectra of $(Sr_{1-x}, Ba_x)_3SiO_5$:Eu phosphors is higher than that of $Ba_3SiO_5$:Eu and $Sr_3SiO_5$:Eu phosphors, and also higher than that of the yellow YAG phosphor (shown with a broken line). That is to say, in the case of 0.5≥x≥0.1, each of the emission center wavelengths λ of fluorescence spectra is 600 nm or more, and the relative fluorescence intensity of fluorescence spectra is higher than that of any one of the $Ba_3SiO_5$:Eu phosphor, the $Sr_3SiO_5$:Eu phosphor, and the yellow YAG phosphor.

In the case of 0.5≥x≥0.2, each of the emission center wavelengths λ of fluorescence spectra is 606 nm or more, and the relative fluorescence intensity of fluorescence spectra is higher than that of the yellow YAG phosphor. In the case of 0.5≥x≥0.1, the fluorescence intensity of the $(Sr_{1-x}, Ba_x)_3SiO_5$:Eu phosphor is about 1.07 to about 1.20 times higher than that of the yellow YAG phosphor.

As described above, a phosphor having an emission center wavelength of 600 nm or more, which is in an orange-light wavelength range, and a fluorescence spectrum with a broad distribution ranging from a yellow-light wavelength range to a red-light wavelength range was obtained by controlling the composition ratio of Sr and Ba. With this phosphor, color rendering in a red-color region can be improved.

An activator concentration dependency (Eu concentration dependency) of the fluorescence intensity of a $(Sr_{1-x}, Ba_x)_3SiO_5$:Eu phosphor will now be described.

FIG. 3 is a table showing the amounts of raw materials blended in synthesis of a $(Sr_{1-x}, Ba_x)_3SiO_5$:Eu phosphor (x=0.5), with a variety of activator concentrations (Eu concentrations) in Example.

A $(Sr_{0.5}, Ba_{0.5})_3SiO_5$:Eu phosphor including $(Sr_{1-x}, Ba_x)_3SiO_5$ with x=0.5 as a base material was synthesized such that the stoichiometric ratio (composition ratio) (molar ratio or atomic ratio) of metal elements Sr, Ba, and Si is Sr:Ba:Si=1.5:1.5:1 and the Eu concentrations are 2, 4, 6, 8, and 10 mol %.

As shown in FIG. 3, strontium carbonate, barium carbonate, silicon dioxide, and europium oxide were used as compounds respectively including Sr, Ba, Si, and Eu. The powders of these compounds were weighed and blended to prepare a mixture. Strontium carbonate, barium carbonate, silicon dioxide, and europium oxide available from Kojundo Chemical Laboratory Co., Ltd. were used.

Each of the powders was weighed and blended to synthesize $(Sr_{0.5}, Ba_{0.5})_{2.94}SiO_5:Eu_{0.06}$, $(Sr_{0.5}, Ba_{0.5})_{2.88}SiO_5:Eu_{0.12}$, $(Sr_{0.5}, Ba_{0.5})_{2.82}SiO_5:Eu_{0.18}$, $(Sr_{0.5}, Ba_{0.5})_{2.76}SiO_5:Eu_{0.24}$, and $(Sr_{0.5}, Ba_{0.5})_{2.70}SiO_5:Eu_{0.30}$, assuming that the activator Eu was equally substituted for Sr and Ba of $(Sr_{0.5}, Ba_{0.5})_3SiO_5$ as a base material.

Figure 4:
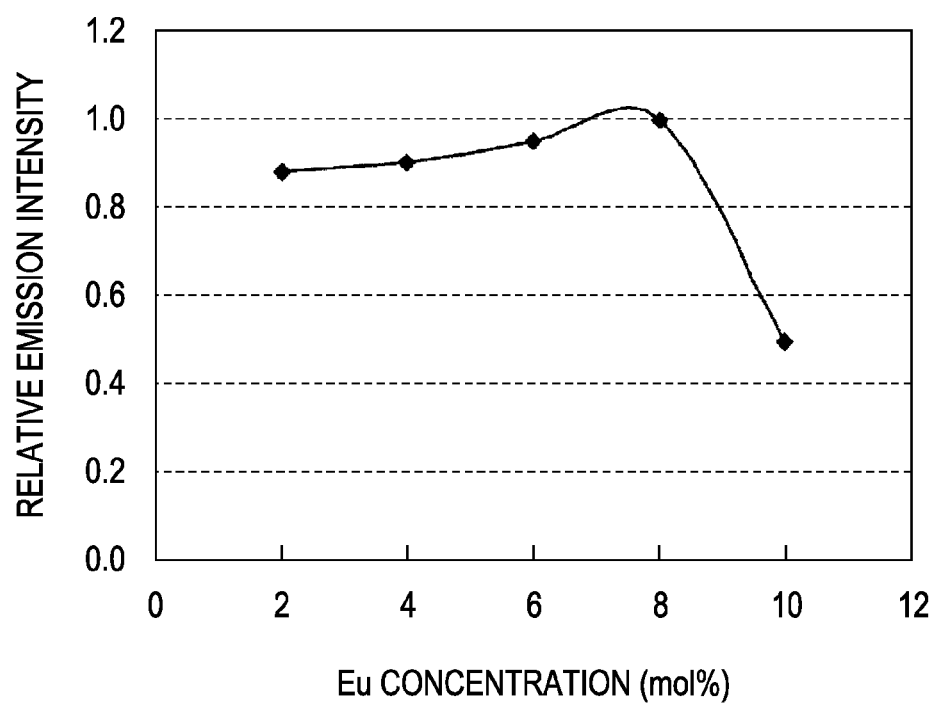
FIG. 4 is a graph showing emission intensity as a function of the Eu concentration of the $(Sr_{1-x}, Ba_x)_3SiO_5$:Eu phosphor (x=0.5) in Example of an embodiment.

FIG. 4 is a graph showing relative emission intensity as a function of the Eu concentration of a $(Sr_{1-x}, Ba_x)_3SiO_5:Eu$ phosphor (x=0.5) in Example of an embodiment.

In FIG. 4, the abscissa indicates Eu concentrations (mol %) and the ordinate indicates relative emission intensities (peak fluorescence spectrum intensities) at an excitation wavelength of 450 nm. The relative emission intensity of phosphors at the peak wavelengths (emission center wavelengths) of their fluorescence spectra was measured with the excitation light source and the fluorescence spectrometer used for measuring the fluorescence spectra shown in FIG. 1 described above. As shown in FIG. 4, the relative emission intensity slowly increases as the Eu concentration is changed from 2 mol % to 8 mol %. At these Eu concentrations, the emission intensity is about 1.8 to about 2 times higher than that at a Eu concentration of 10 mol %. After the Eu concentration exceeds 8 mol %, the relative emission intensity rapidly decreases.

Accordingly, since the peak fluorescence spectrum intensity depends on the composition ratio of Eu as described above, the Eu concentration is preferably 2 mol % or more and 8 mol % or less, more preferably 6 mol % or more and 8 mol % or less. In the case where the Eu concentration is 6 mol % or more and 8 mol % or less, the emission intensity of the phosphor is about 1.9 to about 2 times higher than that of a phosphor having a Eu concentration of 10 mol %.

A method for synthesizing a $(Sr_{1-x}, Ba_x)_3SiO_5:Eu$ phosphor will now be described. At a Eu concentration of 8 mol %, $(Sr_{1-x}, Ba_x)_3SiO_5:Eu$ phosphors with x=0.0, 0.25, 0.5, 0.75, and 1.0 were synthesized.

FIG. 5 is a table showing the amounts of raw materials blended in synthesis of $(Sr_{1-x}, Ba_x)_3SiO_5:Eu$ phosphors (x=0.25, 0.5, and 0.75; Eu=8 mol %) in Example of an embodiment.

The $(Sr_{1-x}, Ba_x)_3SiO_5:Eu$ phosphors including $(Sr_{1-x}, Ba_x)_3SiO_5$ with x=0.25, 0.5, and 0.75 as a base material were synthesized, such that the molar ratio (or atomic ratio) of metal elements Sr, Ba, and Si is Sr:Ba:Si=3(1−x):3x:1, and the Eu concentration is 8 mol %.

As shown in FIG. 5, strontium carbonate, barium carbonate, silicon dioxide, and europium oxide were used as compounds respectively including Sr, Ba, Si, and Eu. The powders of these compounds were weighed and blended to prepare a mixture. Strontium carbonate, barium carbonate, silicon dioxide, and europium oxide available from Kojundo Chemical Laboratory Co., Ltd. were used.

Each of the powders was weighed and blended to synthesize $Ba_{2.76}SiO_5:Eu_{0.24}$, $(Sr_{0.21}, Ba_{0.71})_3SiO_5:Eu_{0.24}$, $(Sr_{0.46}, Ba_{0.46})_3SiO_5:Eu_{0.24}$, $(Sr_{0.71}, Ba_{0.21})_3SiO_5:Eu_{0.24}$, and $Sr_{2.76}SiO_5:Eu_{0.24}$, assuming that the activator Eu was equally substituted for Sr and Ba of $(Sr_{1-x}, Ba_x)_3SiO_5$ as a base material. The amounts of raw materials blended in synthesis of $Ba_{2.76}SiO_5:Eu_{0.24}$ and $Sr_{2.76}SiO_5:Eu_{0.24}$ are omitted.

Phosphors including $(Sr_{1-x}, Ba_x)_3SiO_5$ as a base material and Eu as an activator were synthesized as follows. After 20 g of the mixture prepared by weighing and blending compounds as shown in FIGS. 3 and 5 was placed into a 500 mL plastic bottle, 200 ml of ethanol and 200 g of 5ϕ zirconia balls were added to the mixture. Ball mill mixing was then conducted at 50 rpm for 30 minutes. The ball-milled mixture was subjected to suction filtration and dried at 80° C. for three hours.

The atmosphere surrounding the dried mixture was created by supplying a homing gas (an inert gas (argon, nitrogen, etc.) containing 4% by volume or less of hydrogen) at 1 L/min and by raising the temperature at 300° C./min. The mixture was fired at 1600° C. for four hours in the homing gas atmosphere. The resultant fired product was crushed and powder X-ray diffraction patterns shown in FIGS. 6 to 10 were measured using an X-ray diffractometer (RADIII) available from Rigaku Co., Ltd. with a Ni filter and CuKα rays (wavelength 0.1541 nm).

Figure 6:
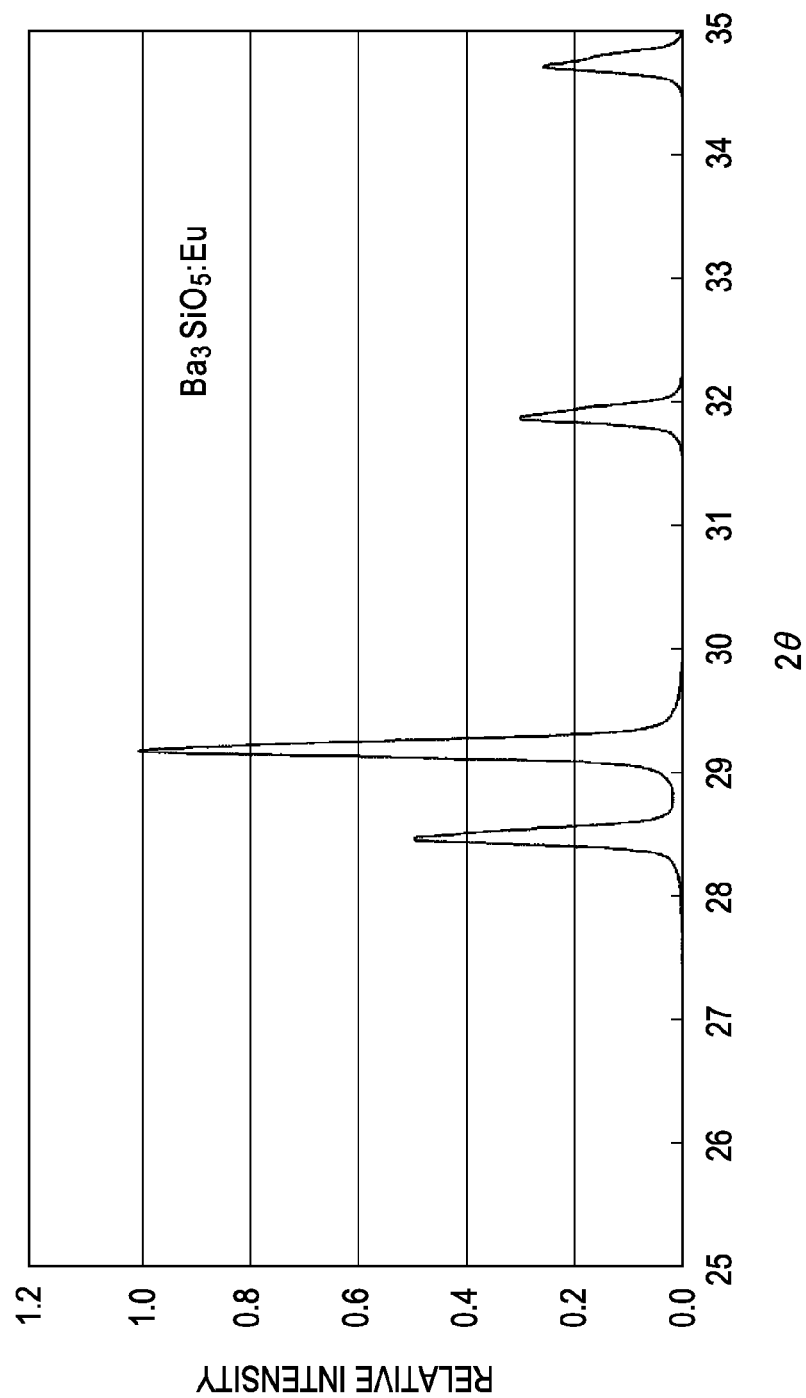
FIG. 6 is a graph showing a measured X-ray diffraction pattern (principal part) of a $Ba_3SiO_5$:Eu phosphor in Example of an embodiment.

FIG. 6 is a graph showing a measured X-ray diffraction pattern (principal part) of a phosphor including $Ba_3SiO_5:Eu$ with x=1.0 as a base material in Example of an embodiment.

Figure 7:
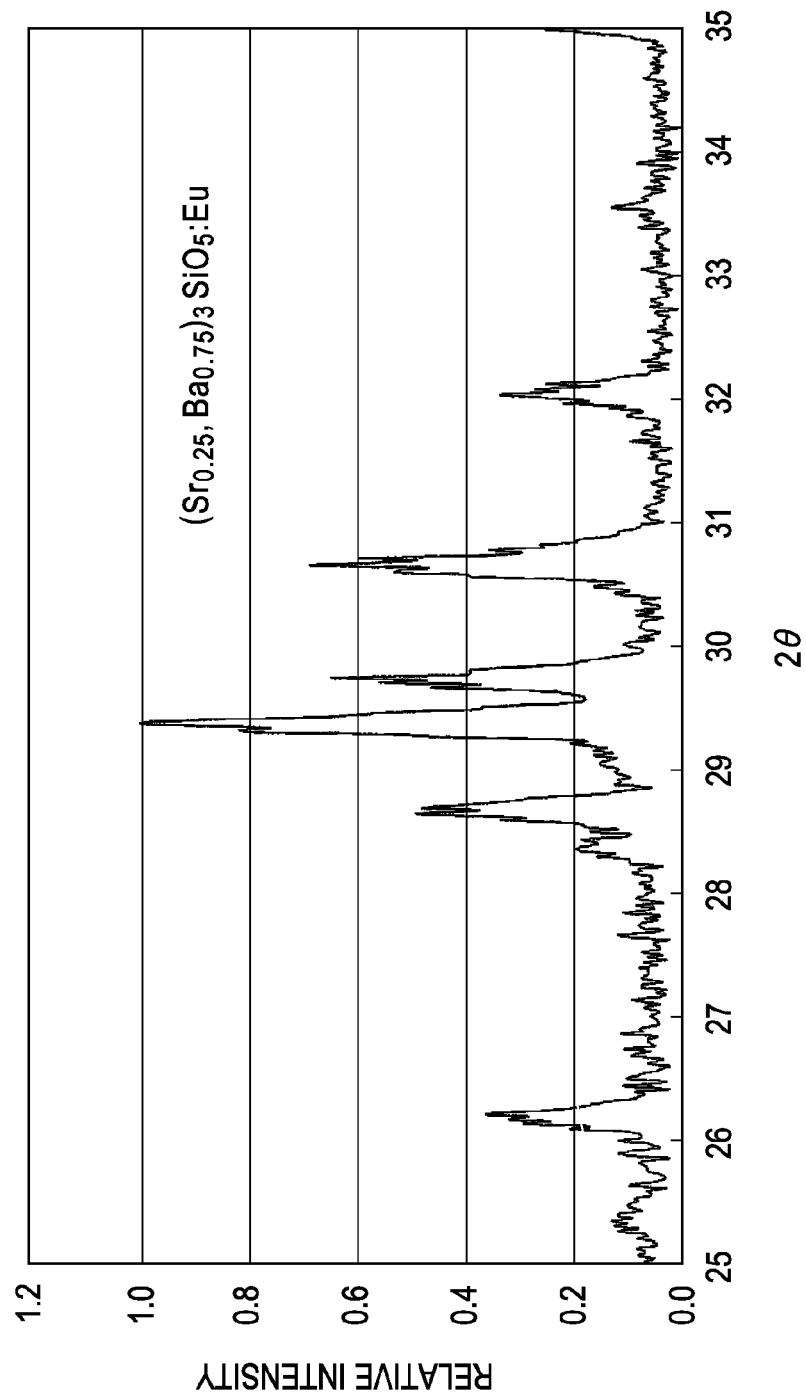
FIG. 7 is a graph showing a measured X-ray diffraction pattern (principal part) of a $(Sr_{0.25}, Ba_{0.75})_3SiO_5$:Eu phosphor in Example of an embodiment.

FIG. 7 is a graph showing a measured X-ray diffraction pattern (principal part) of a phosphor including $(Sr_{0.25}, Ba_{0.75})_3SiO_5:Eu$ with x=0.75 as a base material and synthesized by blending the raw materials shown in FIG. 5, in Example of an embodiment.

Figure 8:
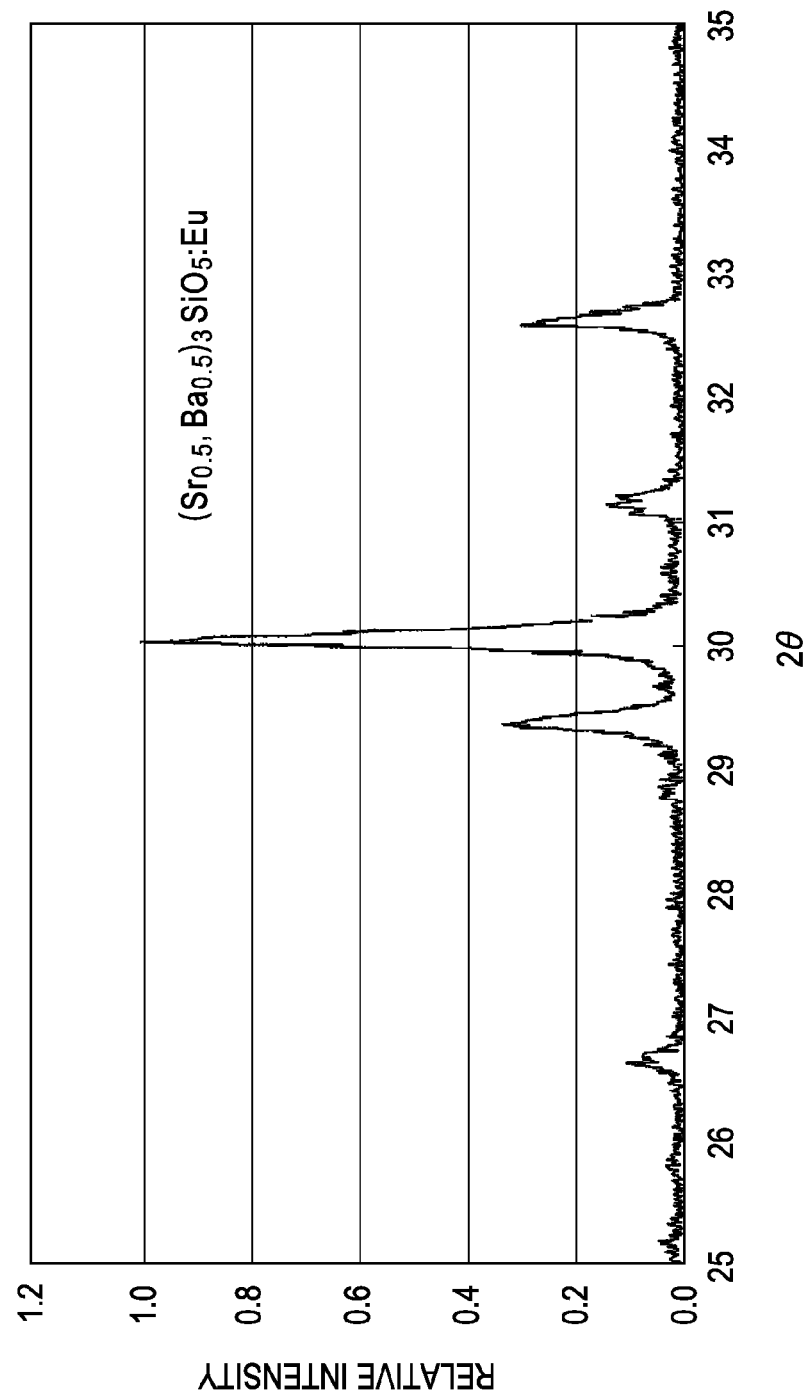
FIG. 8 is a graph showing a measured X-ray diffraction pattern (principal part) of a $(Sr_{0.5}, Ba_{0.5})_3SiO_5$:Eu phosphor in Example of an embodiment.

FIG. 8 is a graph showing a measured X-ray diffraction pattern (principal part) of a phosphor including $(Sr_{0.5}, Ba_{0.5})_3SiO_5:Eu$ with x=0.5 as a base material and synthesized by blending the raw materials shown in FIG. 5, in Example of an embodiment.

Figure 9:
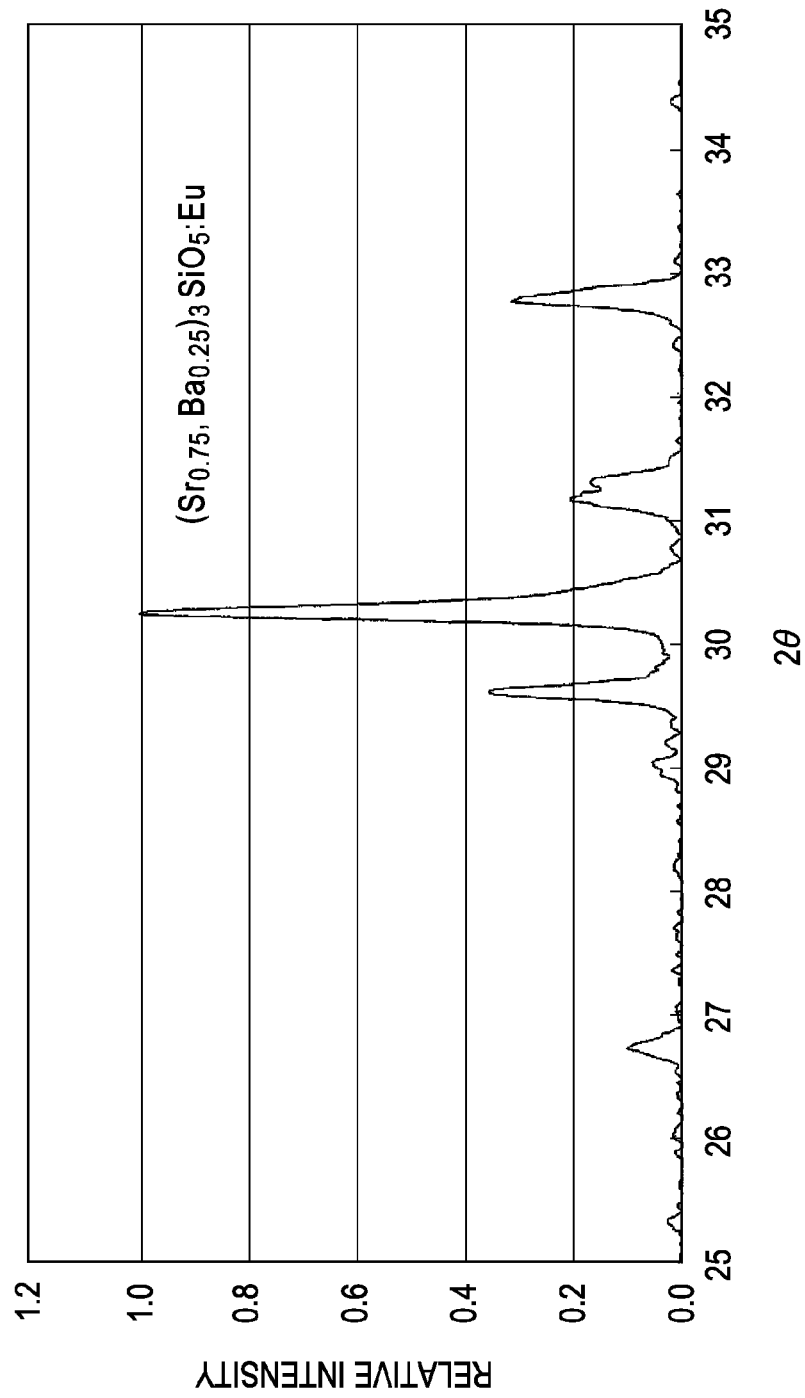
FIG. 9 is a graph showing a measured X-ray diffraction pattern (principal part) of a $(Sr_{0.75}, Ba_{0.25})_3SiO_5$:Eu phosphor in Example of an embodiment.

FIG. 9 is a graph showing a measured X-ray diffraction pattern (principal part) of a phosphor including $(Sr_{0.75}, Ba_{0.25})_3SiO_5:Eu$ with x=0.25 as a base material and synthesized by blending the raw materials shown in FIG. 5, in Example of an embodiment.

Figure 10:
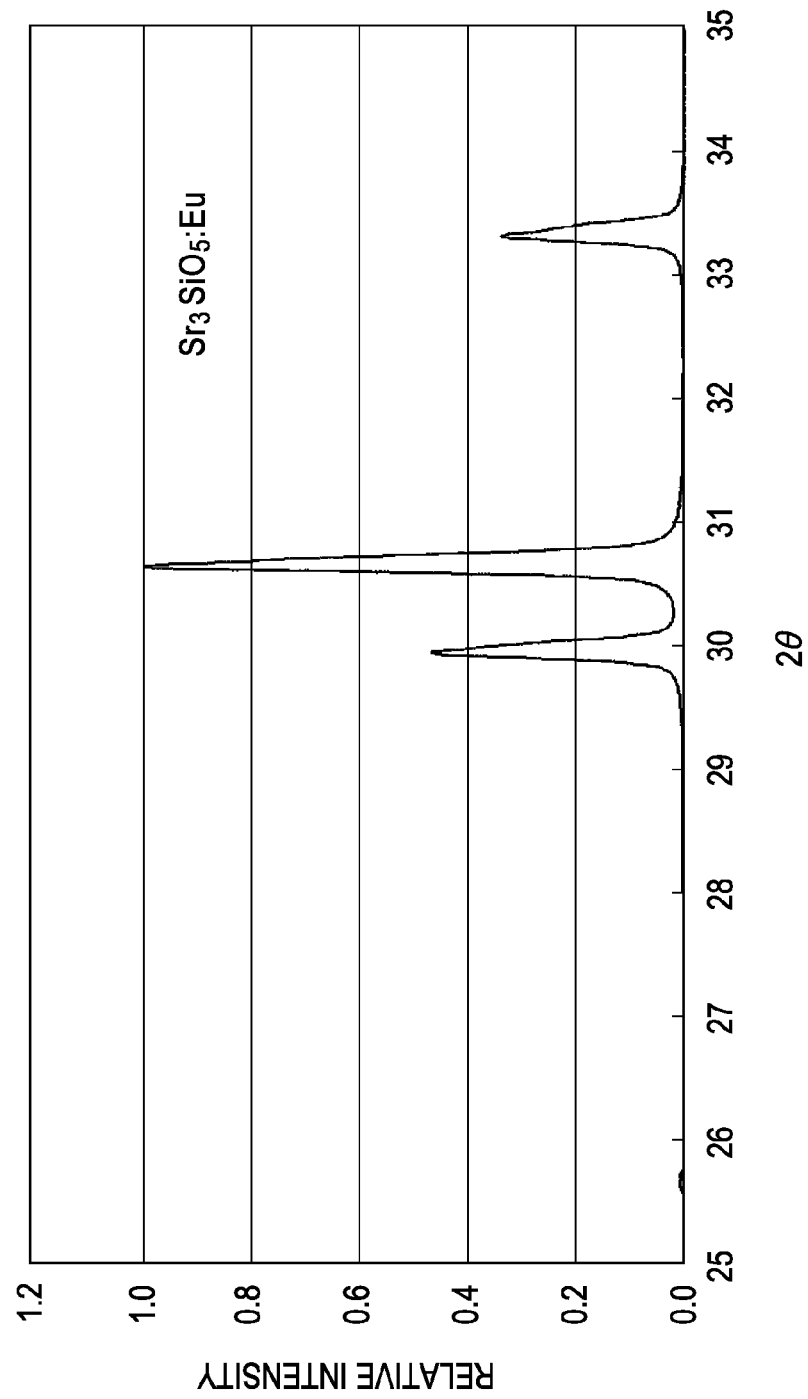
FIG. 10 is a graph showing a measured X-ray diffraction pattern (principal part) of a $Sr_3SiO_5$:Eu phosphor in Example of an embodiment.

FIG. 10 is a graph showing a measured X-ray diffraction pattern (principal part) of a phosphor including $Sr_3SiO_5:Eu$ with x=0.0 as a base material in Example of an embodiment.

In FIGS. 6 to 10, the abscissa indicates diffraction angles 2θ (degree) and the ordinate indicates relative diffraction intensities. Lattice constants a and c were determined as follows using the X-ray diffraction patterns shown in FIGS. 6 to 10, assuming that the $(Sr_{1-x}, Ba_x)_3SiO_5:Eu$ phosphors are tetragonal. The unit of diffraction angle 2θ is degree.

In the $Ba_3SiO_5:Eu$ phosphor, a=7.30$_2$ nm and c=11.2$_4$ nm were obtained from FIG. 6 using diffraction peaks at diffraction angles 2θ=28.4$_5$ ((h,k,l)=(2,1,1)), 2θ=29.1$_5$ ((h,k,l)=(2,0,2)), 2θ=31.8$_0$ ((h,k,l)=(0,0,4)), and 2θ=34.7$_0$ ((h,k,l)=(2,2,0)).

In the $(Sr_{0.25}, Ba_{0.75})_3SiO_5:Eu$ phosphor, a=7.25 nm and c=11.1$_3$ nm were obtained from FIG. 7 using diffraction peaks at diffraction angles 2θ=28.6$_5$ ((h,k,l)=(2,1,1)), 2θ=29.4$_0$ ((h,k,l)=(2,0,2)), and 2θ=32.0$_5$ ((h,k,l)=(0,0,4)).

In the $(Sr_{0.5}, Ba_{0.5})_3SiO_5:Eu$ phosphor, a=7.0$_8$ nm and c=10.9$_6$ nm were obtained from FIG. 8 using diffraction peaks at diffraction angles 2θ=29.35 ((h,k,l)=(2,1,1)), 2θ=30.0$_5$ ((h,k,l)=(2,0,2)), and 2θ=32.6$_0$ ((h,k,l)=(0,0,4)).

In the $(Sr_{0.75}, Ba_{0.25})_3SiO_5:Eu$ phosphor, a=7.0$_2$ nm and c=10.9$_4$ nm were obtained from FIG. 9 using diffraction peaks at diffraction angles 2θ=29.6$_0$ ((h,k,l)=(2,1,1)), 2θ=30.2$_5$ ((h,k,l)=(2,0,2)), and 2θ=32.7$_5$ ((h,k,l)=(0,0,4)).

In the $Sr_3SiO_5:Eu$ phosphor, a=6.95 nm and c=10.7$_6$ nm were obtained from FIG. 10 using diffraction peaks at diffraction angles 2θ=29.9$_0$ ((h,k,l)=(2,1,1)), 2θ=30.6$_0$ ((h,k,l)=(2,0,2)), and 2θ=33.3$_0$ ((h,k,l)=(0,0,4)).

Figure 11:
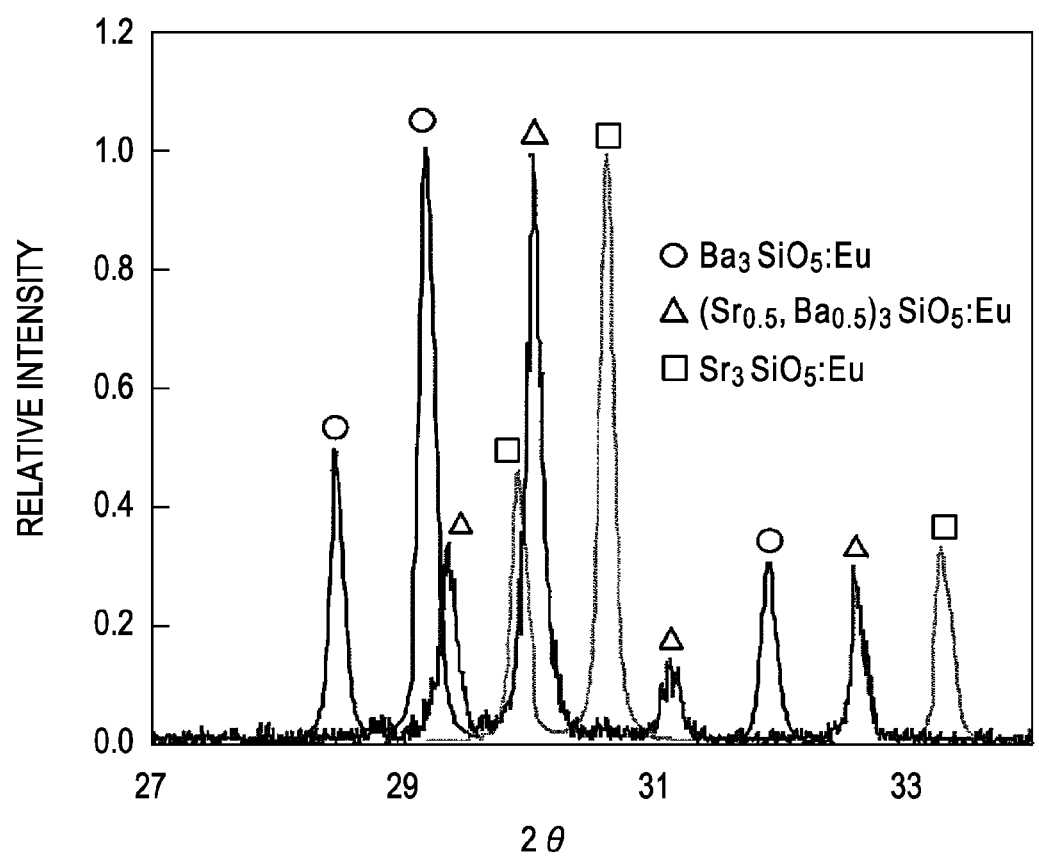
FIG. 11 is a graph showing a relationship between the composition x of the $(Sr_{1-x}, Ba_x)_3SiO_5$:Eu phosphors and measured X-ray diffraction patterns (principal part) in Example of an embodiment.

FIG. 11 is a graph showing a relationship between the composition x of $(Sr_{1-x}, Ba_x)_3SiO_5:Eu$ phosphors (x=0.0, 0.5, and 1.0) and measured X-ray diffraction patterns (principal part) in Example of an embodiment.

In FIG. 11, measured X-ray diffraction patterns at a diffraction angle 2θ of 27° to 34° shown in FIG. 6 ($Ba_3SiO_5$:Eu phosphor), FIG. 8 (($Sr_{0.5}$, $Ba_{0.5}$)$_3SiO_5$:Eu phosphor), and FIG. 10 ($Sr_3SiO_5$:Eu phosphor) are superimposed on each other. A circle, a triangle, and a square in FIG. 11 represent diffraction peaks derived from the $Ba_3SiO_5$:Eu phosphor, the ($Sr_{0.5}$, $Ba_{0.5}$)$_3SiO_5$:Eu phosphor, and the $Sr_3SiO_5$:Eu phosphor, respectively.

Referring to FIG. 11, the diffraction peak of the ($Sr_{0.5}$, $Ba_{0.5}$)$_3SiO_5$:Eu phosphor is present between the diffraction peaks of the $Sr_3SiO_5$:Eu phosphor and the $Ba_3SiO_5$:Eu phosphor. Thus, Vegard's Law holds in this case, and a phosphor having a desired composition ratio, that is, Sr:Ba=1:1 is considered to have been synthesized.

Figure 12:
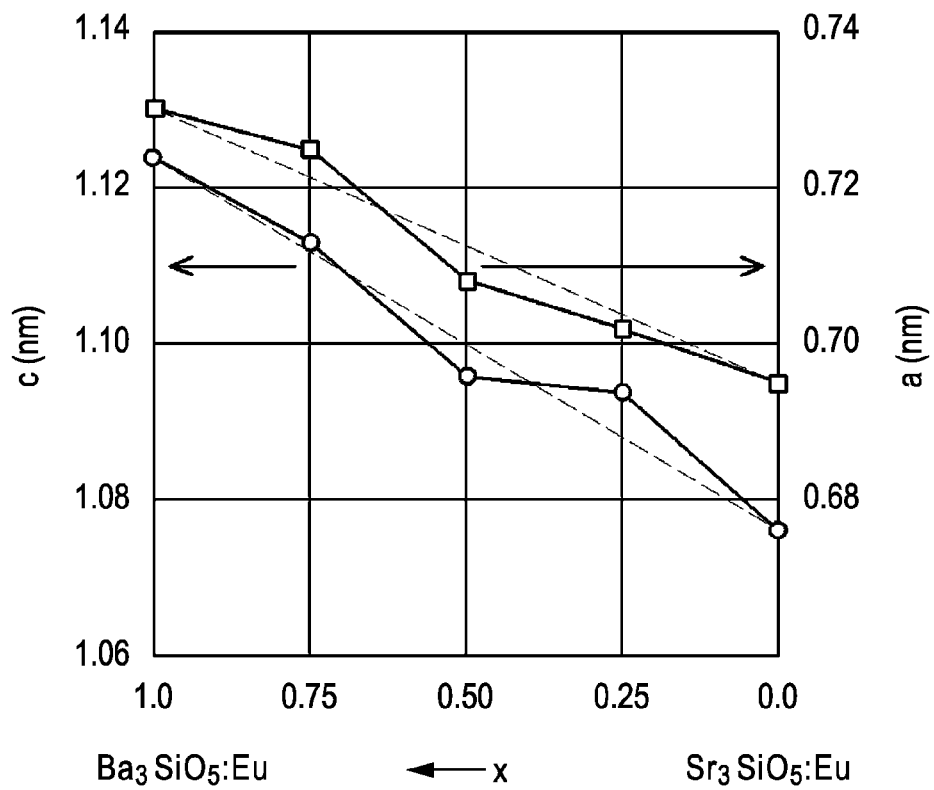
FIG. 12 is a graph showing a relationship between the composition x of the $(Sr_{1-x}, Ba_x)_3SiO_5$:Eu phosphors and lattice constants derived from the measured X-ray diffraction patterns in Example of an embodiment.

FIG. 12 is a graph showing a relationship between the composition x of ($Sr_{1-x}$, $Ba_x$)$_3SiO_5$:Eu phosphors (x=0.0, 0.25, 0.5, 0.75, and 1.0) and lattice constants a and c derived from the measured X-ray diffraction patterns in Example of the an embodiment.

FIG. 12 shows the derived lattice constants a and c (nm) as a function of the composition x of ($Sr_{1-x}$, $Ba_x$)$_3SiO_5$:Eu phosphors. As shown in FIG. 12, the lattice constants a and c are plotted near dashed lines in the drawing and vary linearly with the composition x. Thus, Vegard's Law holds in this case, and a ($Sr_{1-x}$, $Ba_x$)$_3SiO_5$:Eu phosphor having a desired composition x is considered to have been synthesized.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. A method for manufacturing a phosphor including ($Sr_{1-x}$, $Ba_x$)$_3SiO_5$ as a base material and europium (Eu) as an activator, comprising:
   preparing a mixture of compounds respectively including Sr, Ba, Si, and Eu such that a molar ratio of Sr, Ba, and Si is Sr:Ba:Si=3(1−x):3x:1 where 0.5≥x≥0.25, and a ratio of the number of moles of Eu to a total number of moles of Sr, Ba, and Eu is 0.06 or more and 0.08 or less; and
   firing the mixture at 1600° C. or more and 1700° C. or less in an inert gas atmosphere containing 4% or less of hydrogen on a volume basis,
   wherein a peak emission wavelength of the phosphor is 600 nm or more based on a composition ratio of Sr, Ba, and Eu.

2. The method for manufacturing the phosphor according to claim 1 that emits fluorescence when excited with blue light.

* * * * *